United States Patent [19]
Hastings

[11] Patent Number: 5,760,623
[45] Date of Patent: Jun. 2, 1998

[54] RAMP VOLTAGE GENERATOR FOR DIFFERENTIAL SWITCHING AMPLIFIERS

[75] Inventor: Roy A. Hastings, Allen, Tex.

[73] Assignee: Texas Instruments Incorporated, Dallas, Tex.

[21] Appl. No.: 670,077

[22] Filed: Jun. 26, 1996

[51] Int. Cl.$^6$ .................................................. H03K 4/06
[52] U.S. Cl. ........................... 327/137; 327/95; 327/96; 327/132; 327/135; 327/136; 327/337
[58] Field of Search .................................. 327/131–140, 327/336, 337, 91, 94, 95, 96

[56] References Cited

U.S. PATENT DOCUMENTS

| | | | |
|---|---|---|---|
| 4,705,961 | 11/1987 | Ainsworth et al. | 327/132 |
| 4,988,900 | 1/1991 | Fensch | 327/337 |
| 4,990,833 | 2/1991 | Morrish | 327/134 |
| 5,317,199 | 5/1994 | Jordan | 327/134 |
| 5,391,999 | 2/1995 | Early et al. | 327/337 |
| 5,394,020 | 2/1995 | Nienaber | 327/134 |

FOREIGN PATENT DOCUMENTS

| 6-222729 | 8/1994 | Japan | 327/131 |
|---|---|---|---|

*Primary Examiner*—Timothy P. Callahan
*Assistant Examiner*—Kenneth B. Wells
*Attorney, Agent, or Firm*—Alan K. Stewart; Wade James Brady, III; Richard L. Donaldson

[57] ABSTRACT

A low-power differential switching amplifier (200, 210, 220, 230) is provided which utilizes a unique technique of generating interlaced ramps. The interlacing of the ramps causes the ramp discharge time to be effectively zero, which produces exceptionally accurate sawtooth waveforms with virtually no distortion. The timing of the differential switching amplifier circuitry can be synchronized with an external clock. A voltage null point is produced in the differential amplifier where zero voltage at the input of the amplifier produces essentially zero power dissipation within the load, even if the load is low-Q or substantially resistive. Also, by use of a phase balancing technique, residual errors resulting from component mismatches, which would otherwise have imposed power losses upon the load, are nulled out automatically during the operation of the amplifier. Furthermore, conventional input bias circuitry can be excluded, which reduces the size, complexity and overall power requirements of the integrated circuit.

15 Claims, 4 Drawing Sheets

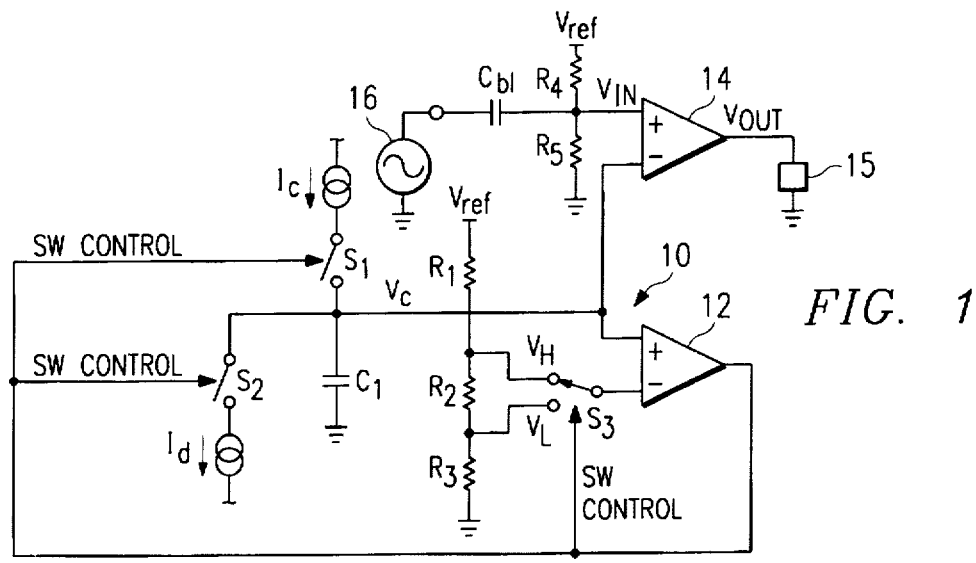
FIG. 1
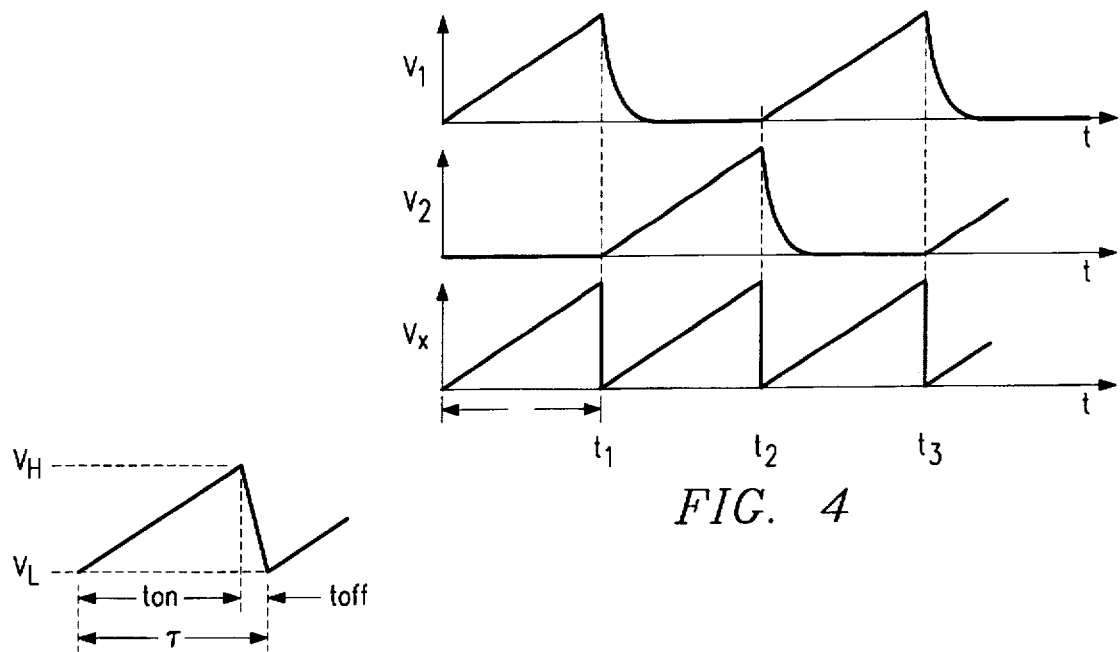
FIG. 4
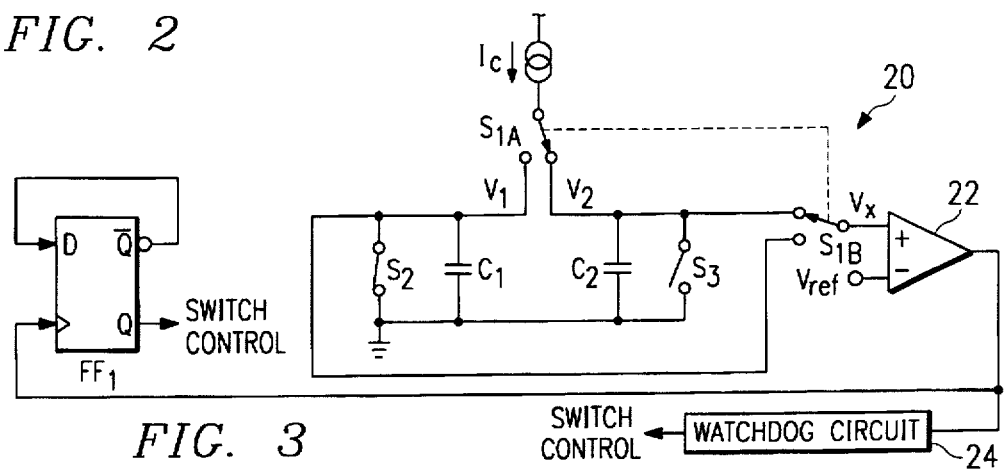
FIG. 2
FIG. 3

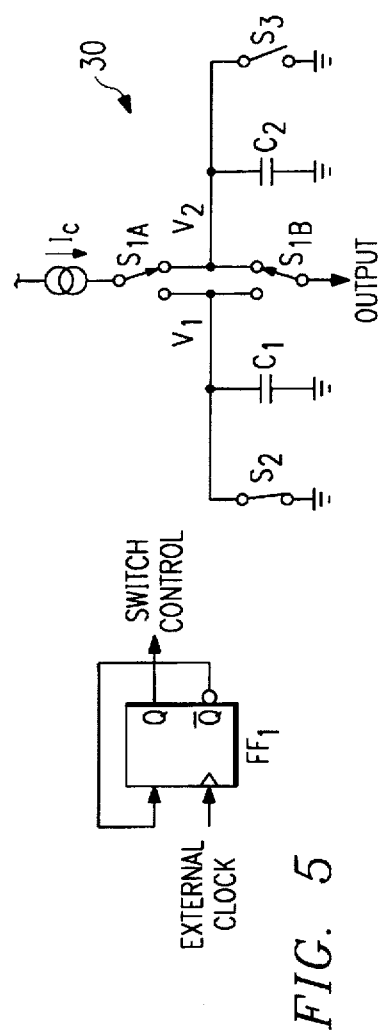
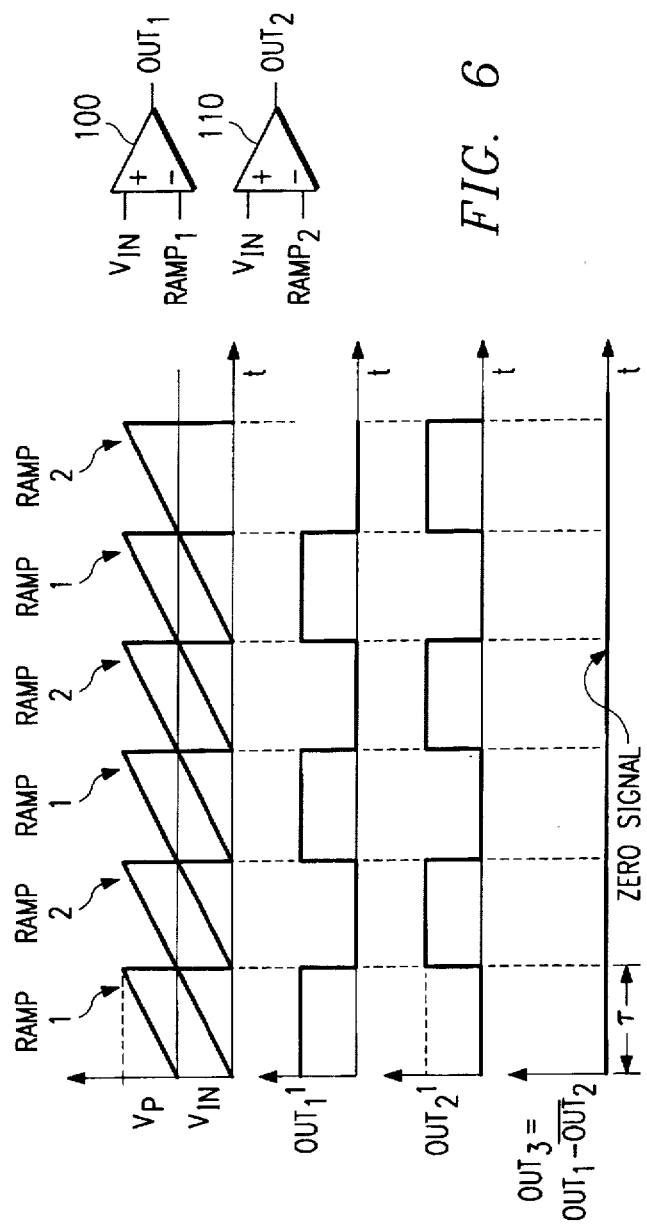

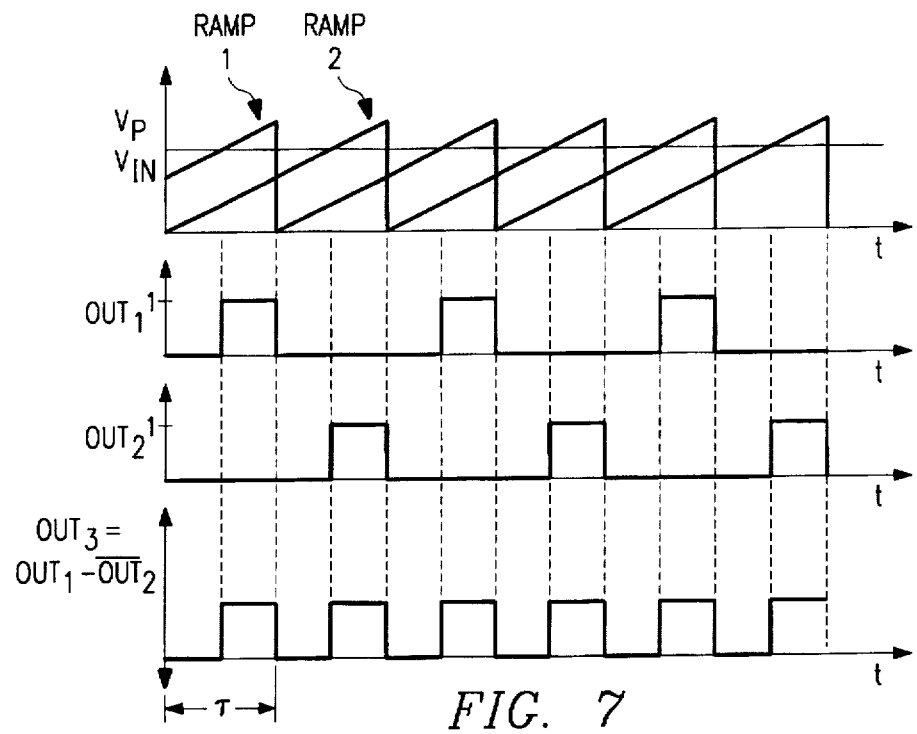
FIG. 7
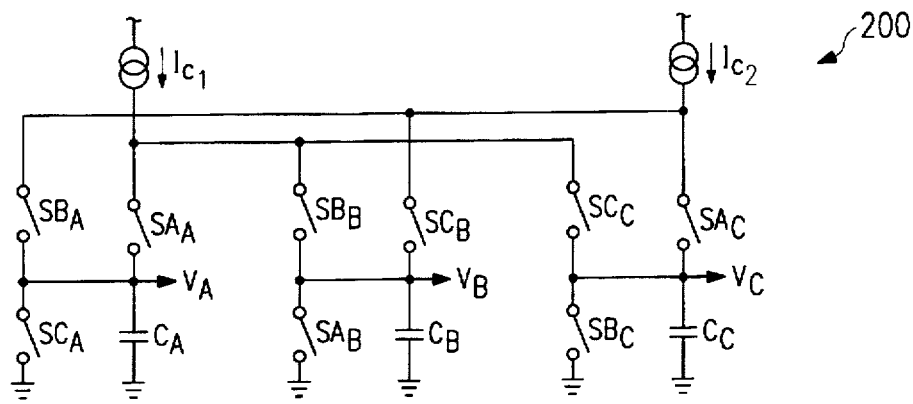
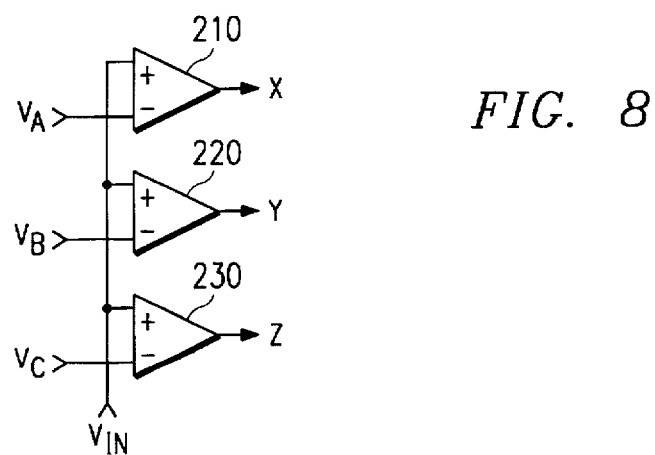
FIG. 8

RAMP VOLTAGE GENERATOR FOR DIFFERENTIAL SWITCHING AMPLIFIERS

This application claims priority under 35 USC §119(c)(1) of provisional application number 60/000,521, filed Jun. 26, 1995, now abandoned.

TECHNICAL FIELD OF THE INVENTION

This invention relates generally to the field of semiconductor integrated circuits, and more particularly, to a low-power differential switching amplifier.

BACKGROUND OF THE INVENTION

Existing class-A and class-B amplifiers consume substantial amounts of standby current and have relatively low efficiencies. A number of switching techniques have been used to improve amplifier efficiencies, but most of the previous topologies circulated AC currents through the output circuits or loads, even when the magnitudes of the input signals to the amplifiers were zero. Consequently, these amplifiers could achieve their theoretical efficiencies only if their loads were purely reactive, and in practice, they relied upon a reactive component of the load to limit dissipation from the circulating AC currents. However, loads for these circuits are often low-Q or highly resistive. Therefore, the theoretical efficiencies of these amplifiers could not be achieved with practical loads.

For example, FIG. 1 is an electrical schematic circuit diagram of a previously developed switching amplifier, including details of the circuitry used to generate sawtooth waveforms. These sawtooth waveforms or ramps are used to generate the rectangular pulses output from the differential amplifier. In order to generate a sawtooth waveform in the circuit (10) shown in FIG. 1, the voltage $V_C$ linearly "ramps up" or increases across capacitor C1 while switch S1 is closed, switch S2 is open, and switch S3 is connected to voltage $V_H$. Switches S1, S2 and S3 are conventional IC electronic switches, such as, for example, field effect transistors configured to perform a switching function. When the voltage ($V_C$) at the positive input connection of comparator 12 is greater than the voltage ($V_H$) at the negative input connection, comparator 12 generates an output signal that "flips" all of the switches, so that switch S1 is open, switch S2 is closed, and switch S3 is connected to the voltage $V_L$. The voltage $V_C$ across capacitor C1 then linearly "ramps down" or decreases until the voltage ($V_C$) at the positive input connection of comparator 12 is less than the voltage ($V_L$) at the negative input connection. At this point, comparator 12 generates another output signal that closes switch S1, opens switch S2, and connects switch S3 to voltage $V_H$, which completes one charge-discharge operational cycle of the sawtooth generator circuit (10). The current level $I_d$ may be selected to be much greater than the current level $I_c$, which ensures that the output waveform $V_{out}$ more closely approximates a sawtooth waveform. Alternatively, the two currents may be chosen to be equal, in which case a triangle waveform is created.

FIG. 2 is a graphic representation of the sawtooth waveform generated at node $V_C$. As discussed above, the output voltage, $V_C$, ramps up (as C1 is charged) to $\approx V_H$ and then ramps down (as C1 is discharged) to $\approx V_L$. The charge time for C1 is shown as $t_{on}$, while the discharge time is shown as $t_{off}$. The sawtooth waveform shown in FIG. 2 illustrates a significant problem with previously developed sawtooth generators such as the circuit shown in FIG. 1. For example, the discharge time interval $t_{off}$ is not equal to zero, because $t_{off}/t_{on}$ is equal to $I_c/I_d$, which has a finite value. Moreover, inherent switching delays cause the output voltage ($V_c$) to overshoot the voltage trip points, $V_L$ and $V_H$, which causes inaccuracies in the shape of the output ramp waveform. Since the overshoot is caused by finite switching delays, the magnitude of the overshoot is proportional to the slew rate of the ramping voltage. As an additional problem, the circuit shown in FIG. 1 would be unreliable if $V_L$ was to equal zero, unless a negative supply voltage were to be made available. This thus limits the magnitude of the ramp which can be generated. Some of these problems can be minimized by utilization of triangle waveforms, but the overshoot of the voltage trip points remains.

Returning to FIG. 1, the switching amplifier (10) also includes a modulator comprising a second comparator 14 which compares the sawtooth waveform generated across capacitor C1 to an input voltage signal $V_{in}$. The duty cycle of the output of the amplifier, $V_{out}$, is proportional to the amplitude of $V_{in}$.

In order to prevent the DC component of the input voltage source 16 from affecting the operating point of the switching amplifier, a blocking capacitor $C_{bl}$ is placed between voltage source 16 and the positive input of comparator 14. Resistors R4 and R5 form a resistor divider biased from a fixed voltage reference, $V_{ref}$, which sets a stable DC voltage level at the input of comparator 14 to ensure a stable operating point for the switching amplifier. This switching amplifier will put out a nonzero duty cycle for an input signal having zero AC signal amplitude, because resistors R4 and R5 set a DC bias on the modulator. This is required so that the circuit can respond to the negative-going portions of the input signal. Unless the load is essentially reactive, this imposes an energy loss upon the system, comprised of the AC power dissipated in the load due to the AC signal present at $V_{out}$. If the load were, for example, an audio speaker, this would lead to substantial power dissipation in the speaker even with no load. The mechanical damping of the speaker would prevent the speaker from responding to the AC component of the signal, but the electrical losses would still remain.

SUMMARY OF THE INVENTION

A need exists in semiconductor integrated circuit applications for an amplifier which can drive an essentially resistive load with high efficiency and which has very low quiescent current. Since power dissipated within the load when the amplifier's input signal is zero adds to quiescent current, standard switching amplifier topologies are not suitable for this application. In accordance with the present invention, a low-power differential switching amplifier is provided which utilizes a unique interlaced ramp generator scheme in combination with a unique phase balancing scheme to provide true low quiescent current operation even with resistive loads. The interlacing of the ramps causes the ramp discharge time to be effectively zero, which produces exceptionally accurate sawtooth waveforms with virtually no distortion.

An important technical advantage of the present invention is that a voltage null point is produced in the differential amplifier where zero voltage at the input of the amplifier produces a net zero voltage difference across the output terminals.

A second important technical advantage of the present invention is that neutralization of phase imbalances is provided by an input capacitor which, through phase balancing, adjusts the amplifier's operating point so as to minimize residual losses.

A third important technical advantage of the present invention is that conventional input bias circuitry can be excluded, which reduces the size, complexity and overall power requirements of the IC.

A fourth important technical advantage of the present invention is that the timing of the differential switching amplifier circuitry can be synchronized with external clocks.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is an electrical schematic circuit diagram of a previously developed switching amplifier including a previously developed sawtooth waveform generator.

FIG. 2 is a graphic representation of the sawtooth waveform generated by the circuit shown in FIG. 1.

FIG. 3 is an electrical schematic circuit diagram of a free running sawtooth waveform generator according to one embodiment of the present invention.

FIG. 4 is a graphic representation of a plurality of sawtooth waveforms generated by the circuit shown in FIG. 3.

FIG. 5 is an electrical schematic circuit diagram of an externally synchronizable sawtooth waveform generator according to a second embodiment of the present invention.

FIG. 6 is a graphic representation of a plurality of waveforms generated according to one aspect of the present invention.

FIG. 7 is a graphic representation of a plurality of waveforms generated according to a second aspect of the present invention.

FIG. 8 is an electrical schematic circuit diagram of an externally synchronizable interlaced sawtooth waveform generator according to a third embodiment of the present invention.

DETAILED DESCRIPTION OF THE INVENTION

Figure 9:
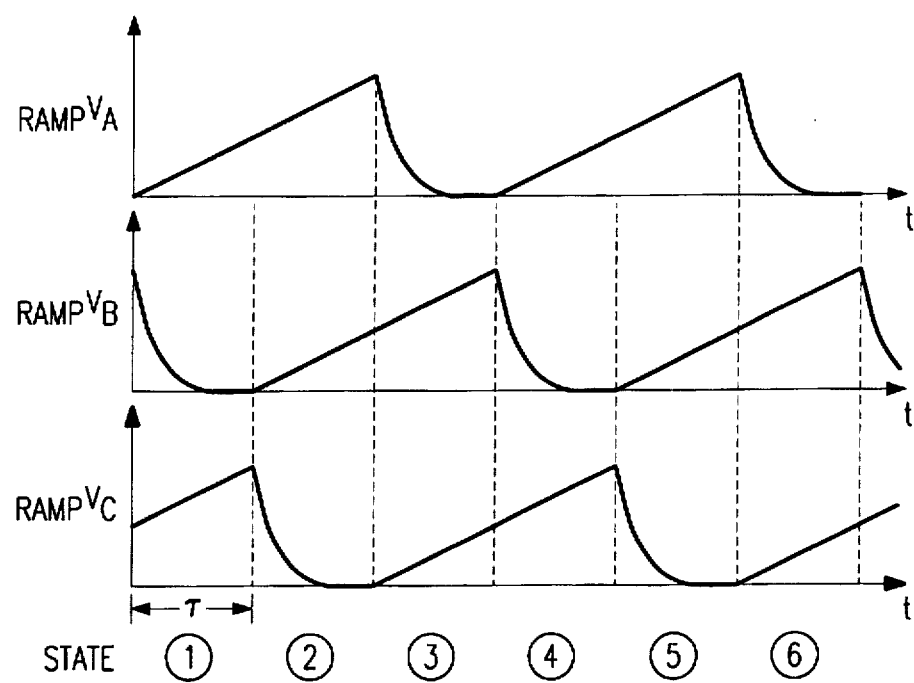
FIG. 9 is a graphic representation of a plurality of sawtooth waveforms or ramps generated by the circuit shown in FIG. 8, along with the six state changes that produce those ramps.

The preferred embodiment of the present invention and its advantages are best understood by referring to FIGS. 1–10 of the drawings, like numerals being used for like and corresponding parts of the various drawings.

FIG. 3 is an electrical schematic circuit diagram of a free running sawtooth waveform generator according to one embodiment of the present invention. Sawtooth wave generator 20 includes two capacitors, C1 and C2. The voltages V1 and V2 produced across respective capacitors C1 and C2 will be sawtooth voltage waveforms, or ramps. The present circuit is operable so as to produce ramps which are synchronized to one another. Switch S1 includes two sections, S1A and S1B, which operate in unison. Switch section S1A is connected to current source $I_c$, and depending on the position of the switch, to one of the capacitors C1 or C2. Switch section S1B is connected to the positive input connection of comparator 22, and depending on the position of the switch, to one of capacitors C1 or C2.

The sections of switch S1 are connected so that when section S1A connects to capacitor C1, so does section S1B, and when switch section S1A connects to capacitor C2, so does section S1B. The negative input connection of comparator 22 is connected to fixed reference voltage $V_{ref}$. Switches S2 and S3 are connected across respective capacitors C1 and C2. As such, the opposite sides of switches S2 and S3 and capacitors C1 and C2, are connected to the circuit ground potential. Switch S2 is connected so that when sections S1A and S1B connect to capacitor C1, switch S2 is open, and when sections S1A and S1B connect to capacitor C2, switch S2 is closed. Switch S3 is connected so that when sections S1A and S1B connect to capacitor C1, switch S3 is closed, and when sections S1A and S1B connect to capacitor C2, switch S3 is open. The output connection of comparator 22 is connected to the clock input of flip-flop FF1. The output of flip-flop FF1 is used to control switches S1, S2 and S3, as will be explained below.

FIG. 4 is a graphic representation of a plurality of sawtooth waveforms generated by the circuit shown in FIG. 3. Referring to FIGS. 3 and 4, assume initially that the Q output (switch control) of flip-flop FF1 is "high". This signal causes switch section S1A to connect current source $I_c$ to capacitor C1. Switch section S1B connects capacitor C1 to the positive input connection of comparator 22. Switch S2 is "open" and switch S3 is "closed." Capacitor C1 charges (ramps up) from zero volts, while capacitor C2 discharges to the circuit ground potential. When the voltage, V1, across capacitor C1 exceeds the reference voltage, $V_{ref}$, at the comparator, the comparator's output goes "high". This rising edge clocks flip-flop FF1, which is configured as a toggle flip-flop. Thus, the Q output of the flip-flop toggles from "high" to "low". Switch section S1A now switches over so as to charge capacitor C2, section S1B connects capacitor C2 to the positive input of the comparator, switch S3 is opened and switch S2 is closed, which discharges capacitor C1 to "ground."

When the voltage, V2, across capacitor C2 exceeds $V_{ref}$ at the comparator, then the comparator's output goes "high," which clocks the flip-flop to start the charge/discharge cycle again. If, under certain abnormal circumstances, both voltages V1 and V2 should become greater than the reference voltage, $V_{ref}$, then the circuit will be unable to generate an edge to clock flip-flop FF1, and the circuit ceases to operate. In the terminology of logic design, this constitutes a trap state. A watchdog circuit 24 is employed to prevent the trap state from stopping the operation of the circuit. Watchdog circuit 24 is a one-shot circuit, whose time delay, $t_{wd}$, is much larger than the period, $\tau$, of the ramp generator. If the watchdog circuit does not receive a positive-going edge at its input for a period of time equal to $t_{wd}$, then it may be safely assumed that a trap state has occurred. The watchdog circuit then produces a pulse at its output which closes both switches S2 and S3 for a sufficient period of time to discharge both capacitors C1 and C2 to near ground potential. This restarts the ramp generator.

As illustrated by the waveforms shown in FIG. 4, the ramping voltages, V1 and V2, alternate, and when combined by switch section S1B, form voltage $V_x$, a virtually ideal sawtooth waveform. Due to the alternation of the ramping voltages, the discharge rate of each of the capacitors is inconsequential. It is thus possible to discharge the capacitors to almost exactly ground potential before the beginning of each ramp. Consequently, overshoot errors are minimized in sawtooth generator circuit 20. The low level overshoot is essentially zero, since the capacitors start charging from a stable voltage. The high level overshoot is minimized, because the off time of the ramp is eliminated, allowing the maximum possible on time, which thus minimizes the slew rate of the ramp.

FIG. 5 is an electrical schematic circuit diagram of an externally synchronizable sawtooth waveform generator according to a second embodiment of the present invention. Sawtooth generator circuit 30 includes capacitors C1 and C2, with switches, S2 and S3, connected across capacitors C1 and C2, respectively, and to the circuit "ground." Switch section S1A is connected to current source $I_c$, and also to one of capacitors C1 or C2, depending on the switch's position. Switch section S1B is connected to output connection, OUTPUT, and also to one of capacitors C1 or C2, again depending on the switch's position. A clock signal from an external periodic source (not explicitly shown) is coupled to the clock input of flip-flop FF1. The Q output of flip-flop FF1 provides the switch control signal to each of switches S1, S2 and S3. The phasing of switches S1, S2 and S3 will be explained below. As connected, flip-flop FF1 forms a toggle flip-flop that alternates states with each input clock signal and thus can be synchronized with the input clock signal.

In operation, when the Q output of flip-flop FF1 goes "high," then switch section S1A is connected to charge capacitor C1, switch section S1B is connected between capacitor C1 and the output $V_{out}$, switch S2 is opened, and switch S3 is closed. Voltage V1 then ramps up. At the next clock input, the Q output of flip-flop FF1 goes "low," then switch section S1A is connected to charge capacitor C2, switch section S1B is connected between capacitor C2 and the output $V_{out}$, switch S2 is closed, and switch S3 is opened. Capacitor C1 discharges, and voltage V2 then ramps up. Advantageously, since flip-flop FF1 is externally clocked, sawtooth waveform generator circuit 30 can generate a virtually ideal sawtooth waveform without experiencing any trap states.

The following section describes how the sawtooth waveform generator concepts described above can be used in a low power differential switching amplifier having zero load current with a zero input signal, even with a highly resistive (low-Q) load. Digressing temporarily, FIG. 6 graphically illustrates the effects of inputting each of two interlaced ramp waveforms to a respective negative input of two comparators 100 and 110. The positive inputs of the comparators are connected to an input signal, which in the example of FIG. 6 is assumed to be a DC voltage. For this case, where $V_{in}=\frac{1}{2} V_p$, the differential output of the two comparators can be shown to yield zero output power. The signals OUT1 and OUT2 in FIG. 6 represent the outputs of comparators 100 and 110, respectively. Each of these signals is a square wave with a 50% duty cycle, aligned 180° out of phase with one another due to the 180° phase shift between the interlaced ramps. The signal OUT3 is the algebraic difference of signal OUT1 and the logical negation of signal OUT2, which is (neglecting switching transitions) zero. The amplitudes of the voltage waveforms OUT1 and OUT2 are assumed to be equal, and for simplicity are normalized to 1, as shown in FIG. 6. This signal OUT3 forms the output of the switching amplifier.

FIG. 7 graphically illustrates the effects of inputting the two interlaced ramps into the same two comparators, but for the case where $V_{in}=\frac{3}{4} V_p$. Since the case where $V_{in}=\frac{1}{2} V_p$ has been shown above to correspond to a zero output signal, the case where $V_{in}=\frac{3}{4} V_p$ logically would be expected to represent one-half of the maximum possible positive output signal. The algebraic difference between signal OUT1 and the logical negation of signal OUT2 is a 50% duty cycle square wave with an amplitude of +1, which when averaged over an integral number of periods of the ramp clock (τ), results in a value of +0.5. This represents one-half of the maximum possible positive output signal, +1. Essentially, these two graphs (FIGS. 6 and 7) demonstrate that the differential output provides a desirable rectangular waveform from the amplifier, and with a 50% input ($V_{in}=\frac{1}{2} V_p$), there is, in effect, a zero output signal. Therefore, the 50% input provides a null point for the amplifier.

In accordance with the present inventive concept, one approach to provide the differential output waveforms shown in FIG. 6 would be to employ, for example, two of the virtually-ideal sawtooth waveform generators described above with respect to FIG. 3 or 5. However, such an implementation would employ four capacitors and one of those four can be shown to be redundant and thus unnecessary. Because the two ramp signals are phase-aligned to one another, and because two output signals must be simultaneously asserted, two capacitors must be simultaneously charged. A third capacitor must be posited to exist if a discharge operation is to be conducted simultaneously with the charging operation. Thus, the minimum number of capacitors required is three. Therefore, a three capacitor sawtooth waveform generator circuit can be used to generate the sawtooth waveforms or ramps desired, as described below. A reduction in the number of capacitors required is advantageous, because accurate capacitors require considerable die area.

FIG. 8 is an electrical schematic circuit diagram of an externally synchronizable interlaced sawtooth waveform generator according to a third embodiment of the present invention. Sawtooth waveform generator circuit 200 includes three ramp capacitors, $C_A$, $C_B$, and $C_C$. Each capacitor has three associated switches to provide six different operating states. Switch $SB_A$ is connected to switches $SC_B$ and $SA_C$, and also to current source $I_{C2}$. Switch $SA_A$ is connected to current source $I_{C1}$ and also to switches $SB_B$ and $SC_C$. Switches $SC_A$, $SA_B$ and $SB_C$ are connected across respective capacitors $C_A$, $C_B$ and $C_C$ to the circuit ground potential. Switches $SB_A$ and $SA_A$ function to connect current sources $I_{C2}$ and $I_{C1}$, respectively, to capacitor $C_A$. Switches $SB_B$ and $SC_B$ function to connect current sources $I_{C1}$ and $I_{C2}$, respectively, to capacitor $C_B$. Switches $SC_C$ and $SA_C$ function to connect current sources $I_{C1}$ and $I_{C2}$, respectively, to capacitor $C_C$. Comparators 210, 220 and 230 are connected to provide signals X, Y and Z. The positive input of each comparator is hooked to the input of the amplifier, while the negative input of each comparator 210, 220 and 230 is connected to $V_A$, $V_B$ and $V_C$, respectively.

FIG. 9 is a graphic representation of a plurality of sawtooth waveforms or ramps generated by the circuit shown in FIG. 8. Because three ramps are interlaced so that each is aligned 120° out of phase to the other two, three periods of the ramp clock, τ, are required to return the ramps to their initial positions. Since a degree of redundancy has been eliminated by using three, rather than four, capacitors, two cycles of three periods each, or a total of six cycles, are required for the entire ramp generation system to return to its initial state. Thus, there are six states assumed cyclically and endlessly repeated, with each state corresponding to state numbers 1–6 in FIG. 9, shown circled for clarity.

Table 1 (below) shows the signals necessary to operate all of the switches shown in FIG. 8. Switch signal $S_D$ is required to compose the output of the amplifier, and is not used to control any switch shown in FIG. 8. A "1" in Table 1 indicates that the corresponding switch is closed, while a "0" indicates that the corresponding switch is open. The states 1–6 in Table 1 correspond exactly to the six state numbers in FIG. 9. It is assumed that the circuit progresses from state to state under the control of an external clock, a periodic signal which feeds a state machine implementing the functions of Table 1. This circuit functions similar to the circuit of FIG. 5, and lacks trap states.

TABLE 1

| STATE | 1 | 2 | 3 | 4 | 5 | 6 |
|---|---|---|---|---|---|---|
| $SA_A$ | 1 | 0 | 0 | 1 | 0 | 0 |
| $SA_B$ | | | | | | |
| $SA_C$ | | | | | | |
| $SB_A$ | 0 | 1 | 0 | 0 | 1 | 0 |
| $SB_B$ | | | | | | |
| $SB_C$ | | | | | | |
| $SC_A$ | 0 | 0 | 1 | 0 | 0 | 1 |
| $SC_B$ | | | | | | |
| $SC_C$ | | | | | | |
| $S_D$ | 0 | 0 | 0 | 1 | 1 | 1 |

Given the above-described switching and signal relationships, a function of the "triple" interlaced ramp differential switching amplifier shown in FIG. 8 can be characterized by the following two state equations:

$$OUT1 = \bar{S}_C S_D X + \bar{S}A \bar{S}_D Y + S_C S_D Z + S_A \bar{S}_D Z \quad (1)$$

$$OUT2 = S_A S_D X + \bar{S}_A S_D Y + \bar{S}_C \bar{S}_D X + S_C \bar{S}_D Z \quad (2)$$

where X, Y and Z are defined as follows:

X=1 if $V_{in} \geq V_A$; X=0 if $V_{in} < V_A$

Y=1 if $V_{in} \geq V_B$; Y=0 if $V_{in} < V_B$

Z=1 if $V_{in} \geq V_C$; Z=0 if $V_{in} < V_C$

The resulting signals OUT1 and OUT2 described in Equations (1) and (2) above are the differential outputs of the low-power differential switching amplifier 200 shown in FIG. 8, which uses interlaced ramp waveform generators in accordance with the teachings of the present invention. The signals X, Y and Z are Boolean variables corresponding to the outputs of comparators 210, 220 and 230. As described above, the load is driven by the algebraic difference between signal OUT1 and the negation of signal OUT2. Although the embodiment shown in FIG. 8 utilizes three interlaced ramp waveform generators, the present invention is not intended to be so limited. For example, four or more interlaced ramp waveform generators can be used if desired, without exceeding the scope of the inventive concept. Similarly, the three comparators described above can be replaced with two comparators which directly generate signals OUT1 and OUT2, and then equations (1) and (2) can be used to synthesize a suitable network of switches to drive the comparators.

Figure 10:
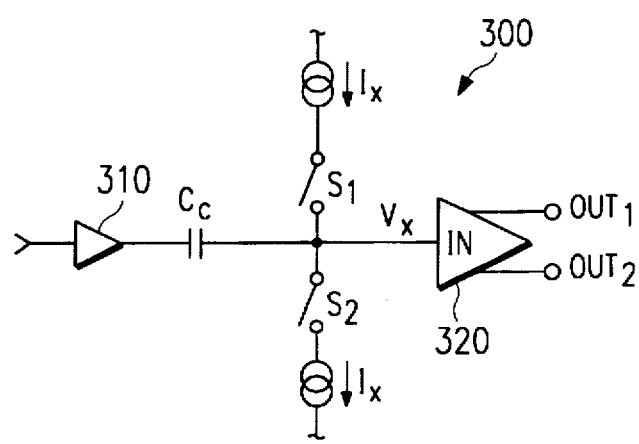
FIG. 10 is an electrical schematic circuit diagram of a phase balancing circuit according to a third aspect of the present invention.

As an additional point, the null point for the ramp generator circuitry shown in FIG. 8 occurs at $V_{in} = \frac{1}{2} V_p$. The present circuit could have been designed to have the null point actually occur at $V_{in} = 0$. However, such a requirement would have significantly increased the design complexity of the overall circuit. In order to simplify the overall circuit, $V_{in} = \frac{1}{2} V_p$ was accepted as a design criteria for the circuit. This presents the difficulty of producing on the input $V_{in}$ of FIG. 8 a DC offset exactly equal to $\frac{1}{2} V_p$. The simple scheme of using a blocking capacitor and a resistive bias network, as illustrated in FIG. 1, is inadequate because inevitable component mismatches will cause the zero-input operating point of the amplifier to diverge away from the desired point (which is the point corresponding to zero power delivered to the load). FIG. 10 is an electrical schematic circuit diagram of a phase-balancing neutralizing circuit 300 that can be used in conjunction with the low-power differential switching amplifier 200 shown in FIG. 8. Neutralizing circuit 300 will minimize the power delivered to the load for a zero input signal, using a feedback technique. Essentially, the neutralizing circuit shown in FIG. 10 can function to replace the previously existing blocking capacitor, $C_{bl}$, and resistive bias network, R4 and R5, illustrated in FIG. 1.

Digressing temporarily, at the null point, during one complete cycle of the state clock described by Table 1 above, the following mathematical relationship should exist:

$$\int_t (OUT1 - OUT2) dt = 0 \quad (3)$$

In other words, the amount of positive drive across the differential output (OUT1−OUT2) should equal the amount of negative drive. If the circuit is not exactly at the null point, the integral of equation (3) will be nonzero, and the magnitude of the integral will be proportional to the distance between the current operating point and the null point. Since any AC input signal, integrated over a sufficiently long period of time, should yield zero (there being no DC component to the signal), the integral of equation (3), if integrated over a sufficient time interval, will always give a value proportional to the distance between the circuit's DC operating point and the desired null point, regardless of the presence of an AC signal at the input.

In neutralizing circuit 300 shown in FIG. 10, the switch S1 is closed when the differential output (OUT1−OUT2) goes positive, and switch S2 is closed when the differential output goes negative. The coupling capacitor $C_C$ also functions as a charge storage capacitor. Assuming the impedance of the drive preamplifier 310 is relatively low (i.e., $I_X R_{out}$ of preamplifier 310 is small compared to the amplitude of the input signal), only a negligible amount of signal distortion is produced by neutralizer circuit 300, imposing an input current upon preamplifier 310. Thus, in operation, switches S1 and S2 connect the current source $I_X$ to the circuit so as to force the voltage $V_X$ in the direction of $\frac{1}{2} V_p$ (the null point). Consequently, the duty cycles of both switches S1 and S2 approach zero as the null is approached. If the switches S1 and S2 are modeled as conductances, their apparent conductances decrease monotonically as their duty cycle decreases, which results in an effective single-pole response for the neutralizer circuit, and which trivializes the problem of stabilizing the overall amplifier circuit.

In summary, and in accordance with the teachings of the present invention, an efficient differential switching amplifier using ramp interlacing is provided which advantageously possesses a null point such that, with a zero input signal, the amplifier allows only zero AC and DC signal components across the output load. These and the other advantages described above can be provided, for example, in an integrated circuit.

Although the present invention and its advantages have been described in detail, it should be understood that various changes, substitutions and alterations can be made herein without departing from the spirit and scope of the invention as defined by the appended claims.

What is claimed is:

1. A ramp voltage generator for use in a low power differential switching amplifier, comprising:

a plurality of ramp voltage generating circuits, each of said ramp voltage generating circuits operable to generate a periodic ramp voltage waveform including a constant-slope segment slewing from a first predetermined voltage potential to a second voltage potential, a time duration between said first predetermined voltage potential and said second voltage potential determined by a control signal;

a comparator circuit operable to generate a switching signal when an input exceeds a third predetermined voltage potential;

a switching circuit selectively operable to connect said input of said comparator circuit to an output of at least one of said ramp voltage generating circuits; and a sequencing circuit operable to control said switching circuit to select each of said constant-slope segments in periodic succession, such that the output ramp voltage waveform of at least one of said ramp voltage generating circuits is reset to said first predetermined voltage potential while an output of a second of said ramp voltage generating circuits is coupled to said input of said comparator circuit, said second of said ramp voltage generating circuits thereby generating an idealized sawtooth ramp voltage waveform, said sequencing circuit responsive to said switching signal.

2. The ramp voltage generator according to claim 1, wherein each of said plurality of ramp voltage generating circuits comprise a capacitor having one terminal connected to a first fixed voltage potential and a second terminal selectively connected to at least one of a plurality of electronic switches, a first of said electronic switches operable to connect said capacitor to a fixed current source to produce a linearly-increasing voltage across said capacitor, and a second of said electronic switches operable to short said terminals so as to discharge said capacitor to zero differential voltage potential.

3. The ramp voltage generator according to claim 2, wherein said first fixed voltage potential comprises circuit ground.

4. The ramp voltage generator according to claim 1, further comprising a watchdog circuit operable to enable a switching of said switching circuit responsive to an indication of a trap state.

5. An externally synchronizable ramp voltage generator for use in a low power differential switching amplifier, comprising:

a plurality of ramp voltage generating circuits, each of said ramp voltage generating circuits operable to generate a periodic ramp voltage waveform including a constant-slope segment slewing from a first predetermined voltage potential for a time duration determined by a control signal;

a comparator circuit operable to generate a switching signal when an input exceeds a second predetermined voltage potential;

a switching circuit selectively operable to connect said input of said comparator circuit to an output of at least one of said ramp voltage generating circuits; and a sequencing circuit operable to control said switching circuit to select each of said constant-slope segments in periodic succession, such that the output ramp voltage waveform of at least one of said ramp voltage generating circuits is reset to said first predetermined voltage potential while an output of a second of said ramp voltage generating circuits is coupled to said input of said comparator circuit, said second of said ramp voltage generating circuits thereby generating an idealized sawtooth ramp voltage waveform, said sequencing circuit responsive to an external periodic signal.

6. The ramp voltage generator according to claim 5, wherein each of said ramp voltage generating circuits comprise an electronic switch coupled to a capacitor.

7. An interlaced ramp generator circuit, comprising:

a plurality of ramp voltage generating circuits, each of said ramp voltage generating circuits operable to generate a periodic ramp voltage waveform including a constant-slope segment slewing from a first predetermined voltage potential for a time duration determined by a control signal;

a plurality of comparator circuits, each operable to generate a switching signal when a respective input exceeds a second predetermined voltage potential;

a plurality of switching circuits, each operable to connect one of said respective inputs of said comparator circuits to a respective output of one of said ramp voltage generating circuits; and a sequencing circuit operable to control each of said switching circuits to select each of said constant-slope segments in periodic succession, such that the output ramp voltage waveform of each of said ramp voltage generating circuits is reset to said first predetermined voltage potential during a time interval when said respective output of said one of said ramp voltage generating circuits is not connected to a comparator circuit, said sequencing circuit responsive to each of said switching signals such that each of said ramp voltage generating circuits thereby generates an idealized sawtooth ramp voltage waveform, said idealized waveforms having a predetermined phase relationship with each other.

8. The interlaced ramp generator circuit according to claim 7, wherein each of said plurality of ramp voltage generating circuits comprise a capacitor having one terminal connected to a first fixed voltage potential and a second terminal selectively connected to at least one of a plurality of electronic switches, a first of said electronic switches operable to connect said capacitor to a fixed current source to produce a linearly-increasing voltage across said capacitor, and a second of said electronic switches operable to short said terminals so as to discharge said capacitor to zero differential voltage potential.

9. The interlaced ramp generator circuit according to claim 8, wherein said first fixed voltage potential comprises circuit ground.

10. The interlaced ramp generator circuit according to claim 7, further comprising a watchdog circuit operable to enable a switching of said switching circuits responsive to an indication of a trap state.

11. The interlaced ramp generator circuit according to claim 7, wherein the plurality of ramp voltage generating circuits comprises at least three ramp voltage generating circuits, each said ramp voltage generating circuit operable to generate a ramp voltage waveform whereby successive ramp voltage waveforms are shifted in phase from each other by 120 degrees.

12. An interlaced ramp differential switching amplifier, comprising:

a plurality of ramp voltage generating circuits, each of said ramp voltage generating circuits operable to generate a periodic ramp voltage waveform including a constant-slope segment slewing from a first predetermined voltage potential for a time duration determined by a control signal;

a plurality of comparator circuits, each operable to generate a switching signal when a respective input exceeds a second predetermined voltage potential;

a plurality of switching circuits, each operable to connect one of said respective inputs of said comparator circuits to a respective output of one of said ramp voltage generating circuits; and a sequencing circuit operable to control each of said switching circuits to select each of said constant-slope segments in periodic succession, such that the output ramp voltage waveform of each of said ramp voltage generating circuits is reset to said first predetermined voltage potential during a time interval when said respective output of said one of said ramp voltage generating circuits is not connected to a comparator circuit, said sequencing circuit responsive to each of said switching signals such that each of said ramp voltage generating circuits thereby generates an idealized sawtooth ramp voltage waveform, said idealized waveforms having a predetermined phase relationship with each other, an arithmetic difference between output voltage levels of two of said comparator circuits defining a differential output, a first of said two of said comparator circuits operable to output a first fixed output voltage when its said respective input exceeds said second predetermined voltage potential and otherwise output a second fixed output voltage, a second of said two of said comparator circuits operable to output said second fixed output voltage when its said respective input exceeds said second predetermined voltage potential and otherwise output said first fixed output voltage, said periodic ramp voltage waveforms controlling a level of said second predetermined voltage potential.

13. The interlaced ramp differential switching amplifier according to claim 12, wherein said first fixed output voltage comprises a supply voltage potential, and said second fixed output voltage comprises circuit ground.

14. The interlaced ramp differential switching amplifier according to claim 12, wherein the plurality of comparator circuits comprises three comparator circuits and the plurality of ramp voltage generating circuits comprises three ramp voltage generating circuits, an input of each comparator circuit coupled to an output of one of said three ramp voltage generating circuits, an output of said each comparator circuit operable to switch states whenever one of said fixed output voltages at an input of said each comparator circuit exceeds said second predetermined voltage potential.

15. The interlaced ramp differential switching amplifier according to claim 12, wherein said differential output is characterized by the state equations:

$$OUT1=\bar{S}_C S_D X + \bar{S}_A \bar{S}_D Y + S_C S_D Z + S_A \bar{S}_D Z$$

and $$OUT2=S_A S_D X + \bar{S}_A S_D Y + \bar{S}_C \bar{S}_D X + S_C \bar{S}_D Z;$$

where X, Y and Z are defined as follows: $X=1$ if $V_{in} \geq V_A$, $X=0$ if $V_{in} < V_A$; $Y=1$ if $V_{in} \geq V_B$, $Y=0$ if $V_{in} < V_B$; and $Z=1$ if $V_{in} \geq V_C$, $Z=0$ if $V_{in} < V_C$; and $S_{A-D}$ represent a plurality of switching states of said switching circuits.

* * * * *